United States Patent [19]

Herman

[11] Patent Number: 5,398,025

[45] Date of Patent: Mar. 14, 1995

[54] INPUT MODULE

[75] Inventor: Jerard I. Herman, Nashua, N.H.

[73] Assignee: Modicon, Inc., North Andover, Mass.

[21] Appl. No.: 974,155

[22] Filed: Nov. 10, 1992

[51] Int. Cl.⁶ .............................................. G08B 21/00
[52] U.S. Cl. .................................... 340/660; 340/644; 340/654; 323/282
[58] Field of Search ............... 340/660, 657, 654, 635, 340/644; 323/284, 289, 282; 324/133

[56] References Cited

U.S. PATENT DOCUMENTS

4,470,041  9/1984  Sutherland ........................ 340/644

Primary Examiner—Jeffery A. Hofsass
Attorney, Agent, or Firm—Ware, Fressola, Van Der Sluys & Adolphson

[57] ABSTRACT

An improved input module is able to sense the ON and OFF states associated with an external signal, wherein that signal complies with standards denoting the ON and OFF condition thereof. The improved input module includes a fixed impedance and a parameter sensor, such as a voltage sensor, which senses at least a portion of the voltage drop across the impedance. In addition, the module includes a current limiter in series with the impedance so as to limit the current flow through the impedance when the threshold parameter has been exceeded. An additional embodiment of the input module includes a second current limiter which is able to selectively detect broken wires associated with the connection of the external signal to the input module.

14 Claims, 5 Drawing Sheets

INPUT MODULE

TECHNICAL FIELD

The present invention relates to input modules and in particular to input modules used for receipt of information from external devices.

BACKGROUND OF THE INVENTION

Input modules and in particular input modules for use in sensing the condition of external devices are well-known in the art. Traditional input modules are used to sense the presence or absence of an electrical signal above or below a threshold level by use of impedance dividers, Z, to define current levels, including minimum and maximum load currents as well as threshold voltage levels, including minimum and maximum trip voltages. The typical characteristics of such prior art input modules are defined approximately by the equation:

$$V = Z*I, \quad (1)$$

where $Z = Z_{in} + Z_{threshold}$. Such a relationship is by definition a linear function of voltage or current. Two standards have been defined by the International Electronic Committee (IEC) with respect to active or power available thresholds. Table 1 describes the basic characteristics of both the IEC type 1 and the IEC type 2 operating voltages as a function of operating current for DC, 120 VAC and 240 VAC input signals.

TABLE 1

|  | IEC TYPE 1 | | | IEC TYPE 2 | | |
| --- | --- | --- | --- | --- | --- | --- |
|  | DC | 120 VAC | 240 VAC | DC | 120 VAC | 240 VAC |
| OFF VOLTAGE LEVEL | −3 TO 5 VDC | 0 TO 20 VAC | 0 TO 40 VAC | −3 to 5 VDC | 0 to 20 VAC | 0 to 40 VAC |
| OFF CURRENT LEVELS | 0 TO 15 ma | 0 TO 15 ma | 0 TO 15 ma | 0 to 30 ma | 0 to 30 ma | 0 to 30 ma |
| ON VOLTAGE LEVELS | 15 to 30 VDC | 79 to (1.1*120) VAC | 164 to (1.1*240) VAC | 11 to 30 VDC | 74 to (1.1*120) VAC | 159 to (1.1*240) VAC |
| ON CURRENT LEVELS | 2 to 15 ma | 2 to 15 ma | 3 to 15 ma | 6 to 30 ma | 6 to 30 ma | 7 to 30 ma |

The type 1 inputs are typically used in industrial environments. This input standard absorbs less power per sense point or input than a type 2 standard, thereby allowing a relatively large number of points to be contained on a single printed circuit board. An example of this type of input is an input module which has a minimum ON threshold current of two milliamps at 15 VDC in a circuit which has linear current curve to $V_{max}$ (30 VDC), so that at $V_{max}$ current equals 4 milliamps. The initial power absorbed by the circuit is therefore 30 milliwatts (P=V*I) at the ON threshold point and reaches 120 milliwatts at $V_{max}$. The total power in a thirty-two input module printed circuit board is therefore 3.84 watts.

The ratio between threshold power and maximum power is described by equation (2):

$$P_{max} = k*P_{threshold}, \quad (2)$$

where $$k = (V_{max}/V_{threshold})^2. \quad (3)$$

If equation 3 is applied to a type 2 input, the minimum results are:

$$k = (30/11)^2 = (2.7272)^2 = 7.438. \quad (4)$$

$$P_{threshold} = V_{threshold}*I_{threshold} = 11*6*E-3 = 0.066 \text{ watt}. \quad (5)$$

$$P_{max}\text{(assuming a 6 milliamp ON threshold current)} = k*P_{threshold} = 7.438*0.066 = 0.4909 \text{ watt/per input}. \quad (6)$$

$$P_{total} \text{ for 32 input points} = 32*0.4909 = 15.71 \text{ watts}. \quad (7)$$

Figure 1:
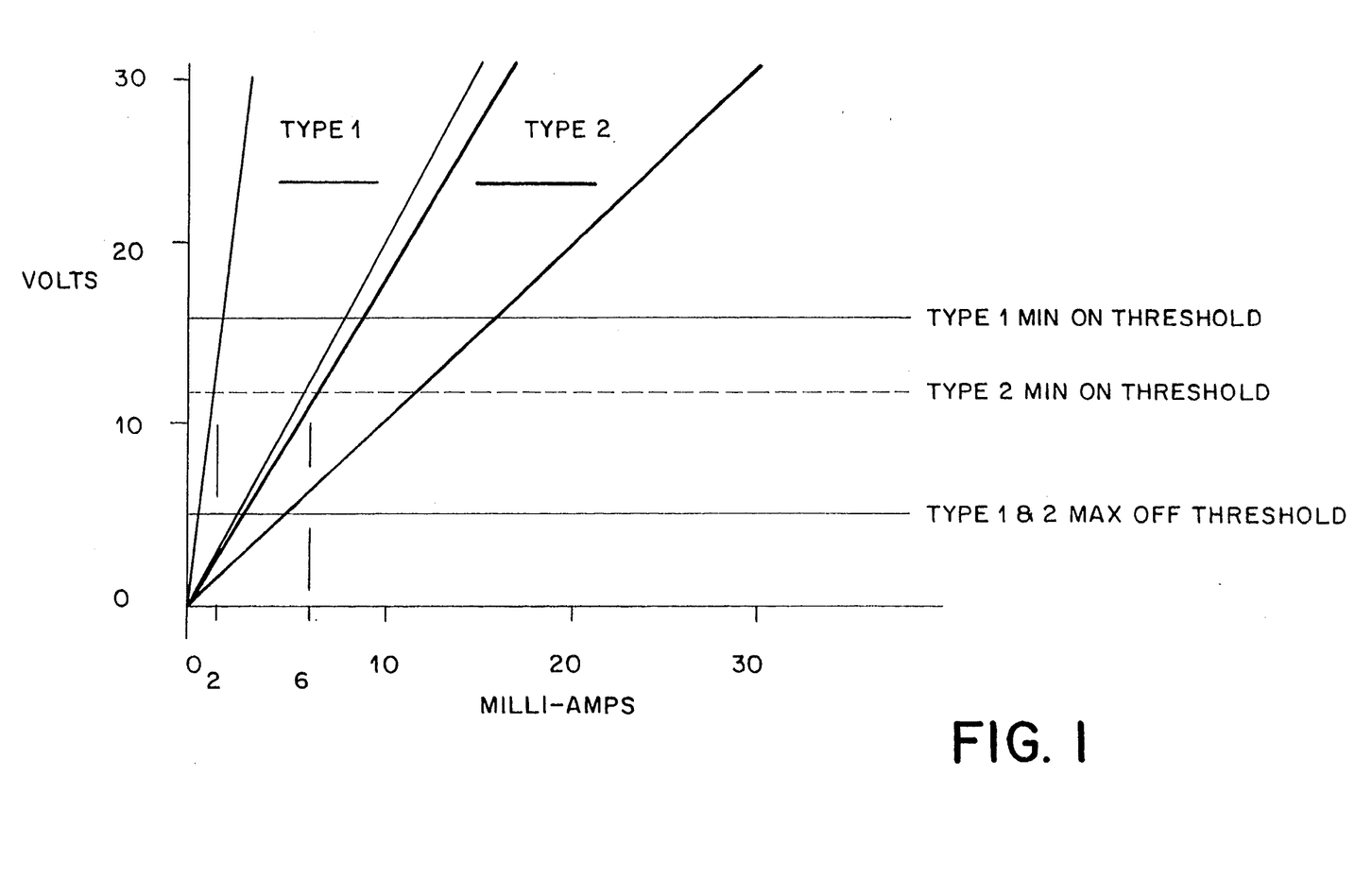
FIG. 1 is a prior art graph showing the range of current levels associated with both type 1 and type 2 inputs for maximum OFF threshold and minimum ON threshold voltage and current levels.

As seen in FIG. 1, prior art linear circuits designed to meet the type 2 minimum ON current (that is 6 milliamps at 11 volts), absorb greater than 13 milliamps at 24 volts and greater than 16 milliamps at $V_{max}$ 30 volts. The improved DC input module according to the present invention provides for a high density input module which consumes smaller mounts of power per input point by modifying the current consumed for each input point after the ON state threshold voltage and current are exceeded.

SUMMARY OF THE INVENTION

An improved DC input module limits the amount of power required for a type 2 input by providing a current limiter which modifies the current associated with an ON condition for the input once the ON state voltage and current thresholds are exceeded. By so doing, the associated power dissipation for input point is dramatically reduced over prior art designs, thereby requiring less heat dissipation per input module and as a result allowing for more input modules to be placed on a single printed circuit board. The operational theory of the invention is that the input circuit senses activity at its input based upon current instead of voltage for purposes of power limitation. Total current is thereby limited at the input to a fixed amount which thereby reduces total power consumption. In this configuration, the series impedance comprising the input impedance $Z_{in}$ and the sense impedance $Z_{sense}$ defines the slope of the current between zero volts and the minimum guaranteed voltage for sensing an ON condition ($V_{threshold}$). The current limiter is a current sink which fixes the maximum current allowed to flow in the circuit for all voltages below the maximum specified ON state voltage ($V_{max}$) for the input.

In an additional embodiment of the present invention, circuitry is presented which is able to sense broken wires from the external device to the input module.

It is therefore a principal object of the present invention to provide an improved DC input module for reducing power consumption for ON state voltage and current levels by limiting the current level associated with the input once the ON voltage and ON current thresholds are exceeded.

A further object of the present invention is to provide an improved input module of the above description further incorporating circuitry for detecting broken wires from the external device to the input module.

A still further object of the present invention is to provide an improved input module of the above description which is particularly designed for operation with IEC type 2 input signals.

Other objects of the present invention will in part be obvious and will in part appear hereinafter.

BRIEF DESCRIPTION OF THE DRAWINGS

For a fuller understanding of the nature and objects of the present invention, reference should be made to the following detailed description taken in conjunction with the following drawings in which.

BEST MODE FOR CARRYING OUT THE INVENTION

As shown in Table 1 above, the International Electronic Committee (IEC) has set forth a type 1 and type 2 standard with respect to the voltage and current levels associated with ON and OFF conditions for sensing the state of an external device at an input point. Traditionally, the circuits used to sense the ON and OFF condition of an external signal have used impedance dividers, with impedance Z defining the current level associated for a given voltage. The typical characteristics of such traditional input circuits are approximately defined by:

$$V = Z*I, \quad (1)$$

where $Z = Z_{in} + Z_{threshold}$. As is evident, the voltage is defined as a linear function of the current and vice versa. As seen in Table 1, the IEC defines the ON voltage threshold ($V_{threshold}$) as 15 volts for a type 1 DC input and 11 volts for a type 2 DC input. The type 1 inputs are typically used in industrial environments due to the fact that the power absorbed by each sense point (or input point) can be lower, thereby allowing larger numbers of input points to be placed on a single printed circuit board. An example of such a circuit is an input having a minimum threshold current of 2 milliamps at 15 VDC in a circuit which has a linear current curve to the maximum permitted ON voltage; namely, $V_{max} = 30$ volts. In such an arrangement, at 30 volts the current would be 4 milliamps. The initial power absorbed by the circuit is thus 30 milliwatts (15*0.002) at the ON threshold and reaches 120 milliwatts at the $V_{max}$ (30*0.004). The total power for thirty-two input modules on a single printed circuit board would thus be 3.85 watts.

The ratio between threshold power and maximum power can thus be described by:

$$P_{max} = k * P_{threshold}, \quad (2)$$

where, $$k = (V_{max}/V_{threshold})^2. \quad (3)$$

For type 1 inputs, the characteristic is basically the same as a physical switch, that is, at zero voltage there is zero current flow. For type 2 inputs, the standard provides for current leakage for the OFF condition which is generally more desirable in a noisy electrical environment found in factories and the like.

For a type 2 input, the ON voltage threshold ($V_{threshold}$) is 11 volts with the maximum ON voltage ($V_{max}$) equal to 30 volts. Thus k is equal to:

$$k = (30/11)^2 = (2.7272)^2 = 7.438.$$

Therefore:

$$P_{threshold} = V_{threshold} * I_{threshold} = *0.006 = 0.066 \text{ watt.}$$

$P_{max}$, assuming a 6 milliamp ON threshold as required for a type 2 input is thus:

$P_{max} = k * P_{threshold} = 7.438 * 0.066 = 0.4909$ watt per input point. Therefore, for a typical application with thirty-two input modules on the same printed circuit board, $P_{total}$ is:

$$P_{total} \text{ for 32 input points} = 32 * 0.4909 = 15.71 \text{ watts.}$$

FIG. 1 illustrates the relationship between voltage and current for type 1 and type 2 input standards from the minimum current to the maximum current allowable for each type. The graph also shows the voltages associated with minimum ON threshold and maximum OFF threshold for both types of inputs.

Figure 2:
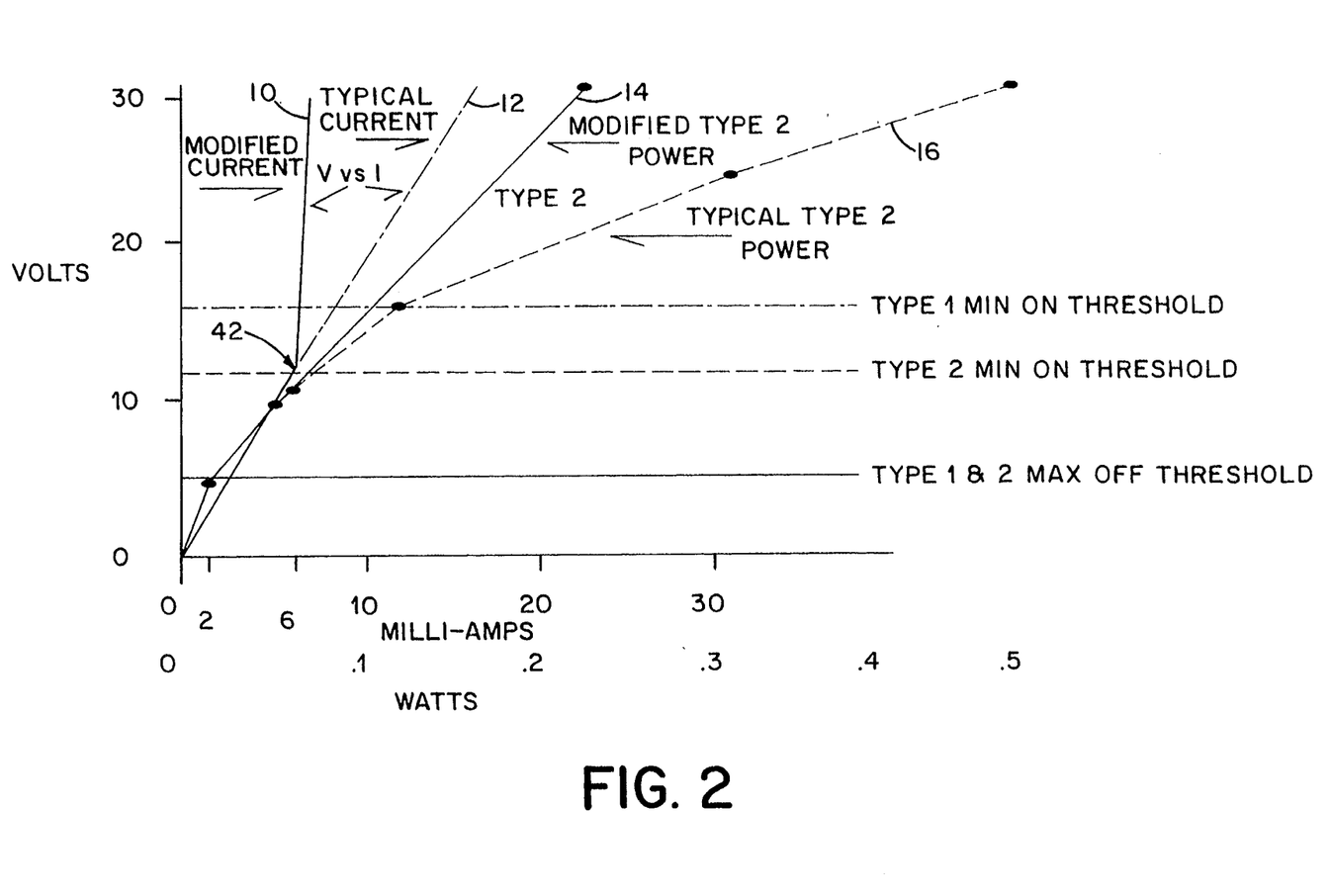
FIG. 2 is a diagram showing both the current and the power consumption per input point as a function of voltage for a conventional type 2 input module and for the improved input module according to the present invention.

FIG. 2 illustrates the typical current 12 and power 16 absorbed for a type 2 input and contrasts that with the current 10 and power 14 absorbed when an improved input module according to the present invention is used. Thus it is seen that traditional linear input modules designed to meet type 2 minimum ON current (6 milliamps at 11 volts) absorb greater than 13 milliamps at 24 volts and greater than 16 milliamps at the $V_{max} = 30$ volts. The corresponding power consumption is seen to be 0.312 watt and 0.480 watt. Such current and thus power consumption is disadvantageous from the point of view of additional power consumption in and of itself and more importantly, due to the additional heat which must be dissipated by each input module, thereby limiting the number of input modules that can be placed on a printed circuit board of a given size.

The improved input module according to the present invention limits the amount of power required for sensing the ON state of a type 2 input by limiting the current flow through the input module after the ON threshold voltage has been exceeded. As seen in FIG. 2, the current waveform 10 of the present invention meets the essential requirements of a type 2 input while simultaneously limiting the power consumption for the input.

Current waveform 12 of a typical type 2 input module has higher current flow after $V_{threshold}$ due to its substantially constant input impedance Z. Similarly, power waveform 14 according to the present invention is substantially lower once the ON voltage threshold is exceeded as compared to power waveform 16 for an input module using a substantially constant input impedance Z.

Figure 3:
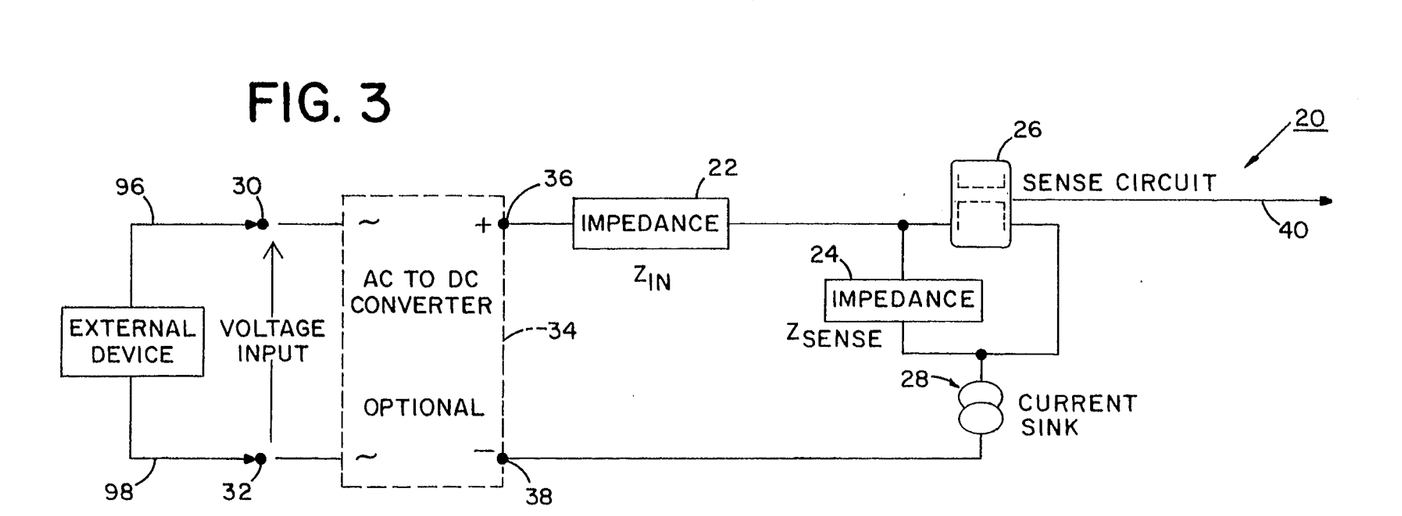
FIG. 3 is a block diagram of an improved input module according to the present invention further illustrating an optional AC to DC converter if the input module is associated with an AC input signal rather than a DC input signal.

FIG. 3 is a block diagram of one preferred embodiment of the present invention which is able to limit the input current from external device 33 after the ON voltage threshold is exceeded. As seen in FIG. 3, the improved input module 20 comprises an input impedance, $Z_{IN}$, 22, a sense impedance, $Z_{sense}$, 24, a voltage sense circuit 26 and a current sink 28. The external device is sensed across terminals 30 and 32. If the input signal at terminals 30 and 32 is an alternating voltage, an optional AC to DC converter 34 can be used so as to generate a DC output at outputs 36 and 38.

In operation, it is seen that sense circuit 26 is able to sense the voltage across the $Z_{sense}$ impedance 24. The current sink 28 is set to limit the maximum current flow therethrough to approximately 6 milliamps which is the minimum current for sensing an ON state as set by the IEC type 2 standard. Thus the sense circuitry senses the voltage across $Z_{sense}$ and generates an appropriate signal representing an ON state for the externally sensed input when this voltage represents the minimum ON threshold voltage, $V_{threshold}$, i.e. 11 volts. This indication is made on output 40. Since the sense circuit is only sensing the voltage across $Z_{sense}$, the voltage representing an ON threshold is necessarily that of the voltage divider defined by:

$$V_{sense\ ON} = V_{threshold} * Z_{sense}/(Z_{in} + Z_{sense}).$$

In order to provide for the minimum required ON state current at $V_{threshold}$, namely 6 milliamps at 11 VDC, the total impedance represented by $Z_{in} + Z_{sense}$ is defined by the following equation:

$$Z_{total} = Z_{in} + Z_{sense} = 11/0.006 = 1.833K\ \Omega.$$

Figure 5:
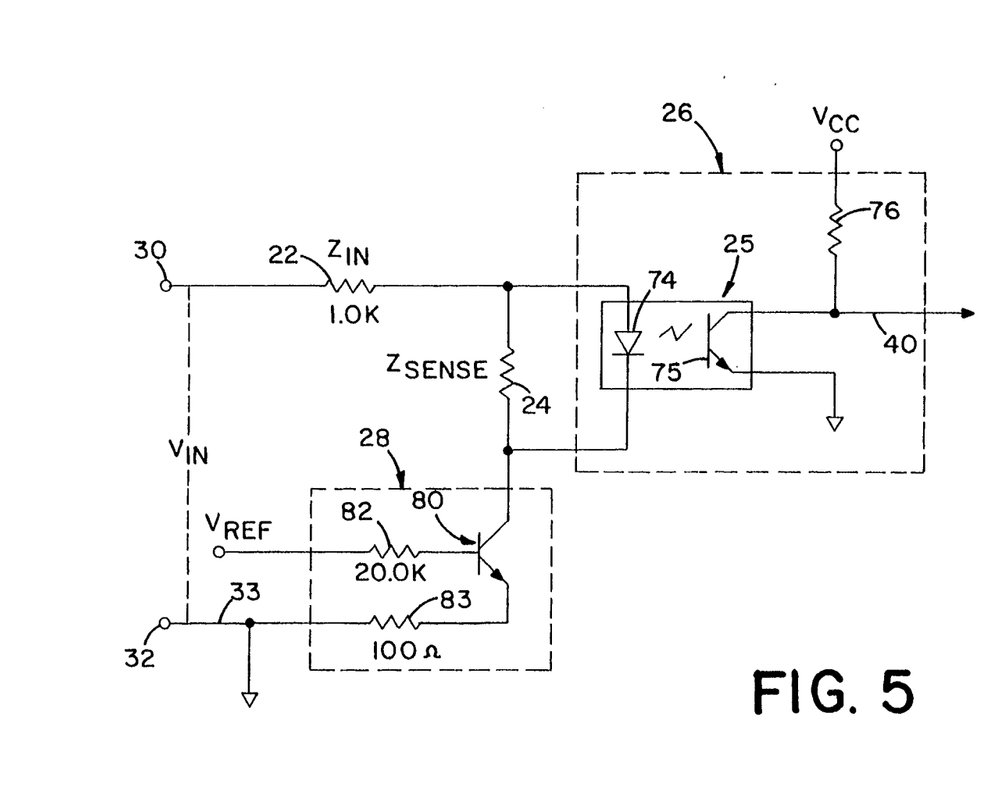
FIG. 5 is a schematic diagram of a DC input module according to the block diagram shown in FIG. 3.

In the preferred embodiment of the present invention, $Z_{in}$ is approximately equal to 1K Ω and consequently, $Z_{sense}$ is approximately equal to 833Ω. FIG. 5 is a schematic diagram of an improved input module according to the block diagram shown in FIG. 3. It is there seen that sense circuit 26 comprises an opto-isolator 25 which in turn includes a diode 74 and an opto-transistor 75 along with a current limiting resistor 76 connected at one end to a DC supply voltage, Vcc. When the voltage across $Z_{sense}$ is equal to the forward voltage drop across diode 74, diode 74 begins to conduct current which in turn generates light that turns transistor 75 ON. Therefore the ON threshold is detected by causing output 40 to go to a low voltage as transistor 75 turns ON, and vice versa when transistor 75 is in the OFF state.

Current sink 28 can preferably comprise a transistor 80 biased into saturation by base current from $V_{Ref}$ of approximately 2.4 VDC limited by resistor 82. Transistor 80 is selected so that its maximum collector current through resistor 83 is approximately 6 milliamps, thereby limiting current flow after $V_{threshold}$ is exceeded. Typically this current limit is slightly greater than 6 milliamps so as to ensure sufficient ON threshold current. Thus, current limiting begins when the ON threshold voltage is exceeded by some small voltage amount.

As is readily apparent from FIG. 3, since current source 28 limits current flow to 6 milliamperes, prior to detection of $V_{threshold}$, the current source is approximately equal to a short circuit (with a fixed voltage drop defined by the VCE saturation of the transistor) and increases its impedance as the sensed voltage exceeds the minimum threshold voltage, namely 11 VDC. The resultant current waveform 10 consequently has a change in slope slightly after the $V_{threshold}$ voltage as shown by location 42 in FIG. 2.

Figure 4:
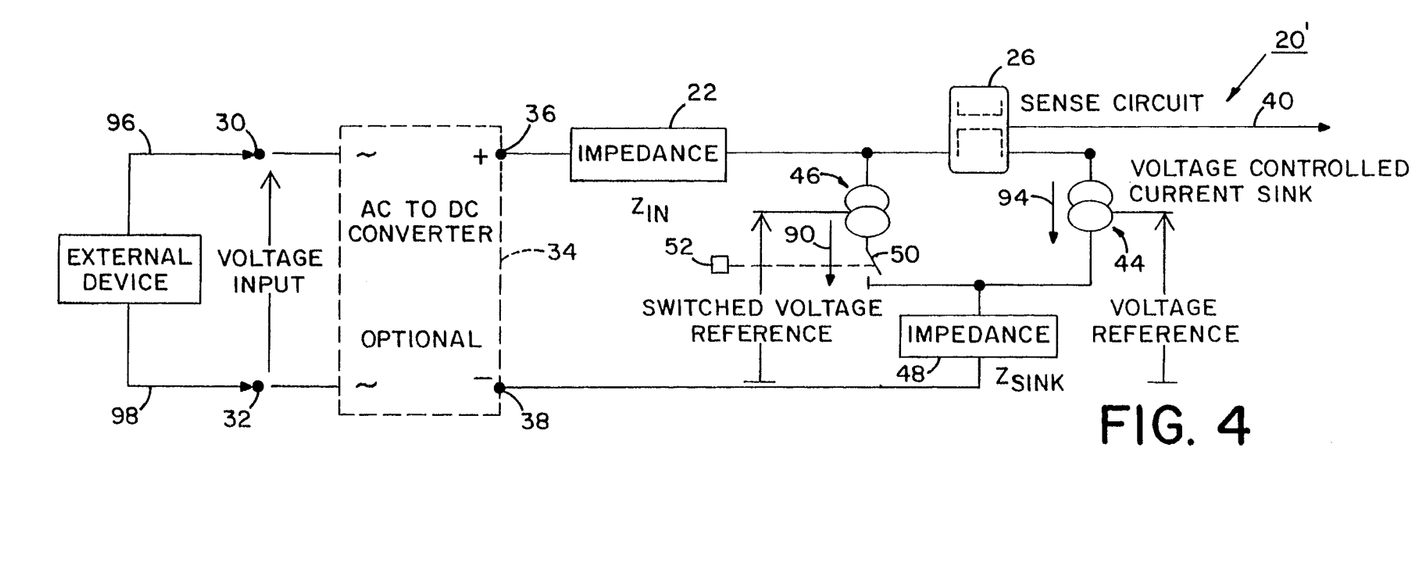
FIG. 4 is a block diagram of an alternative embodiment of an improved input module according to the present invention which is capable of sensing broken wires at the inputs to the module and further shows an optional AC to DC converter if the input circuit is used for sensing AC signals.

FIG. 4 illustrates an alternative embodiment of an improved input module 20' which adds the further capability of being able to generate a signal representing detection of a broken wire 96 or 98 at input terminals 30 or 32 from external device 33. Like components for this embodiment are referenced with the same reference numeral as for the embodiment shown in FIGS. 3 and 5. In this second embodiment, $Z_{sense}$ is replaced with a voltage controlled current sink 44 which is used to set a voltage crossover point in conjunction with impedance $Z_{in}$, 22. In this configuration, the saturated voltage drop across voltage controlled current sink 44 is less than the voltage drop across sense circuit 26. The impedance of the switched voltage reference current sink 46 is higher than that of the voltage controlled current sink 44. Thus the impedance defined by $Z_{in}$ (22)+$Z_{sink}$ (48) controls the current flow through the input module 20' until the ON threshold voltage is sensed. The current flow prior to $V_{threshold}$ is therefore primarily through the path shown by arrow 90. Once the threshold voltage is sensed, the current flow is primarily through the path shown by arrow 94 such that the total current flow is approximately equal to a desired maximum, such as 6 milliamps for an IEC type 2 input. In this way, the current curve 10 shown in FIG. 2 is obtained for this second embodiment of the invention.

The sensing of a broken wire for wire 96 or 98 connected to terminals 30 and 32 respectively is performed by being able to selectively open current path 90 such as shown diagrammatically by switch 50. With current path 90 disconnected, the input current through $Z_{IN}$ (22) must flow through path 94. Since the type 2 input standard allows from zero to 30 milliamps to flow for an OFF state, current flow through the sense circuit can be used to sense a broken input wire. In the block diagram shown in FIG. 4, block 52 is an enable module for controlling the open or closed state of diagrammatic switch 50.

Figure 6:
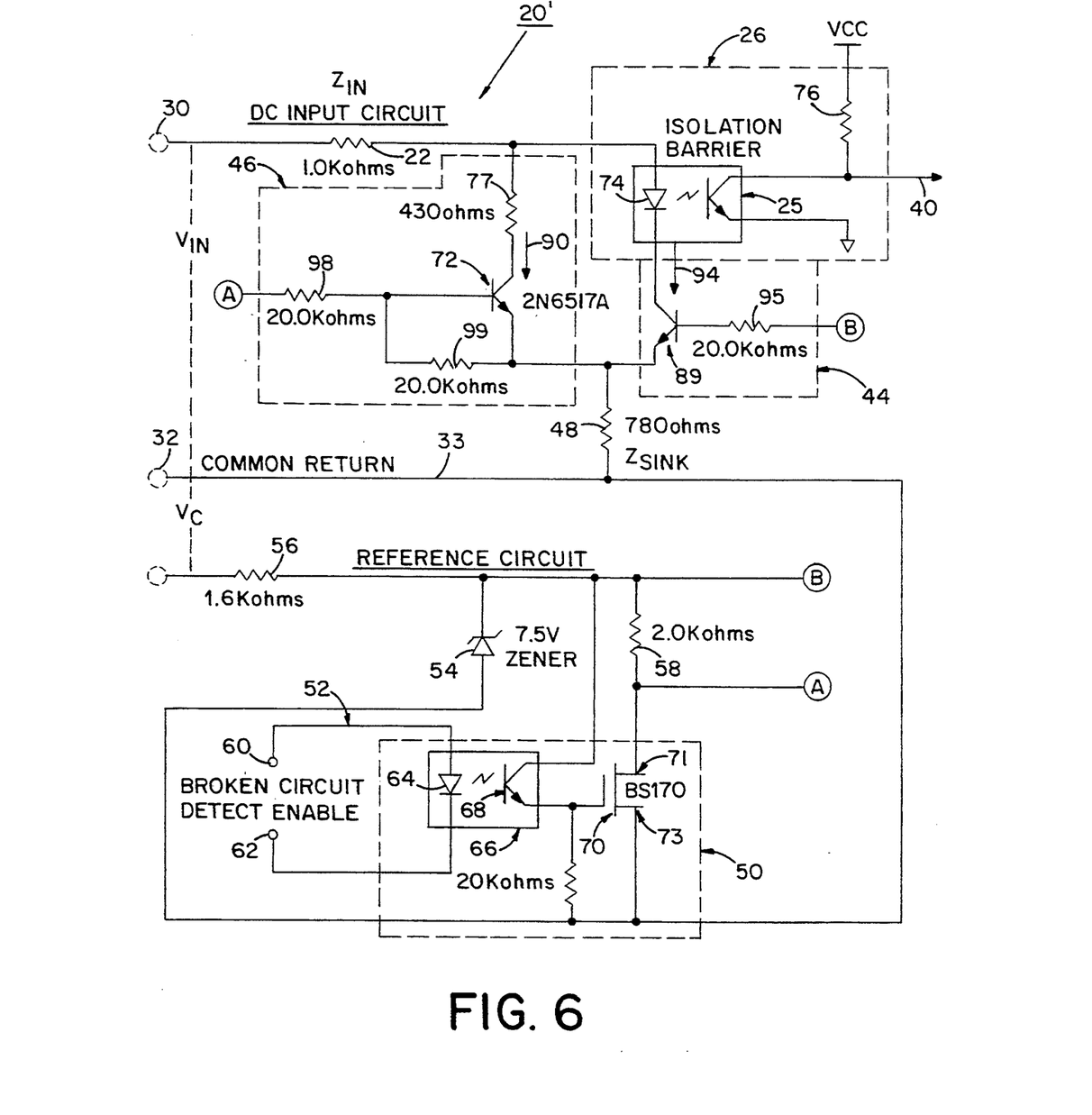
FIG. 6 is a schematic diagram of a DC input circuit according to the block diagram of FIG. 4.

A detailed schematic diagram for the input module 20' is shown in FIG. 6. As seen there, Vcc represents a source voltage which in combination with zener diode 54 and resistors 56 and 58 generate reference voltages A and B.

As seen in FIG. 6, if a voltage is not present across terminals 60 and 62 of broken circuit detect enable module 52, then diode 64 of opto-isolator 66 is not activated, thereby maintaining opto-transistor 68 in an open state, thereby preventing FET 70 from being activated (no current flow through source 71 and drain 73), which in turn provides for a voltage at terminal A. With a reference voltage present at terminal A, resistors 98 and 99 cause transistor 72 to be in saturation, thereby allowing current flow through path 90. Since diode 74 of opto-isolator 25 has a forward voltage drop of approximately 1.2 volts and resistor 77 is 430Ω, this voltage drop across diode 74 is not normally seen until the 11 volts $V_{threshold}$ value is exceeded.

However, when broken circuit detect enable module 52 is activated, the voltage at voltage reference A is essentially at ground potential (common return 33), thereby turning transistor 72 OFF and forcing the current flow to pass through diode 74. Provided that the input voltage across terminal 30 and 32 is at least 2.4 VDC, diode 74 will conduct through transistor 89 forwardly biased into saturation by current flow through resistor 95 from voltage reference B. Current flow through diode 74 generates a low voltage on output line 40 which in turn indicates that no broken wires are present. If however either wire 96 or 98 is broken, no current can flow through diode 74 and this condition is similarly detected by a higher voltage on output line 40.

It is thus seen that the objects set forth above are efficiently attained and, since certain changes can be made in the above embodiments without departing from the scope of the invention, it is intended that all mater contained in the above description or shown in the accompanying drawings shall be interpreted as illustrative and not in a limiting sense.

It is also to be understood that the following claims are intended to cover all of the genetic and specific features of the invention herein described, and all statements of the scope of the invention which, as a matter of language, might be said t o fall therebetween.

What is claimed is:

1. An improved input module for sensing the ON and OFF states of an external signal comprising:
   A) input means for receipt of the external signal;
   B) means for sensing a parameter of the external signal, so as to generate an ON output signal if a threshold of said parameter is exceeded and for generating an OFF output signal otherwise;
   C) input impedance means effectively electrically connected across said input means; and
   D) current limiting means connected to the input impedance means so as to limit the current flow through said input means when said parameter is greater than said threshold.

2. An improved input module as defined in claim 1, wherein the parameter is a voltage, wherein the input impedance means comprises a first input impedance ($Z_{in}$) connected at one end to the input means, and a second input impedance ($Z_{sense}$) connected at one end to the second end of the first input impedance and at its second end to the current limiting means, wherein the means for sensing a parameter is connected across the second input impedance so as to sense the voltage drop across that second input impedance.

3. An improved input module as defined in claim 2, wherein the means for sensing the parameter comprises an opto-isolator, wherein a diode forming a portion of the opto-isolator is connected across the second input impedance and generates light when the voltage across the second input impedance exceeds a voltage proportional to said threshold.

4. An improved input module as defined in claim 3, wherein the current limiting means comprises a transistor having its collector connected to the second end of the second input impedance ($Z_{sense}$) and its emitter connected to the input means and wherein said transistor is biased so as to be in saturation, thereby limiting current flow through its collector-emitter junction.

5. An improved input module as defined in claim 2, further comprising means for selectively reducing the current flow through the second input impedance ($Z_{sense}$) and thereby causing increased current flow through the means for sensing a parameter, said selective current means for detecting a broken connection to the input means by the absence of current flowing through the means for sensing a parameter under such conditions.

6. An improved input module as defined in claim 5, wherein the first input impedance ($Z_{in}$) is sufficiently low so as to cause sufficient current flow through the means for sensing a parameter when said means for sensing a parameter is below the ON threshold value.

7. An improved input module as defined in claim 1, wherein the external signal has an OFF voltage level of −3 VDC to 5 VDC, an OFF current level of 0 to 30 milliamps, an ON voltage level of 11 to 30 VDC, and an ON current level of 6 milliamps to 30 milliamps, and wherein the threshold is a voltage threshold of 11 VDC.

8. An improved input module as defined in claim 1, wherein the external signal has an alternating voltage and wherein the improved input module further comprises means, connected to the input means, for convening the alternating voltage external signal into a uni-polarity voltage, said uni-polarity voltage being presented at a pair of output terminals, and wherein the input impedance means is connected to one of said output terminals and the current limiting means is connected at one end to the other output terminal.

9. An improved input module for sensing the ON and OFF states of an external signal which for a direct current signal has an OFF voltage level of −3 VDC to 5 VDC, and OFF current level of 0 to 30 milliamps, an ON voltage level of 11 to 30 VDC, and an ON current level of 6 milliamps to 30 milliamps, comprising:
   A) input means for receipt of the external signal;
   B) impedance means connected at one end to said input means;
   C) current limiting means connected at one end to the input means and to second end of the impedance means, for limiting the current flow through the impedance means after the ON threshold voltage is exceeded; and
   D) means for sending the voltage across at least a portion of the impedance means so as to generate an ON output signal if the ON threshold voltage is exceeded and an OFF output signal otherwise.

10. An improved input module for detecting the ON and OFF states of an external signal based upon the external signal respectively exceeding or not exceeding an ON threshold voltage, comprising:
   A) input means for receipt of the external signal;
   B) first impedance means ($Z_{in}$) connected at one end to the input means;
   C) second impedance means ($Z_{sense}$) connected at one end to the second end of the first impedance means;
   D) first current limiting means connected to the second end of the second impedance means for limiting the current flow through the second impedance means;
   E) means for sensing the voltage across at least the second impedance means so as to generate an ON output signal if the voltage across the second impedance means is indicative of the ON threshold voltage being exceeded and generating an OFF output signal otherwise;
   F) second current limiting means connected to the voltage sensing means for limiting current flow through the voltage sensing means; and
   G) means for selectively inhibiting the first current limiting means so as to effectively prevent current flow through the second impedance means, thereby causing at least most current flow passing through the first impedance means to pass through the voltage sensing means so as to allow said voltage sensing means to generate an ON type signal when the input voltage is less than the ON threshold value provided that the external signal is able to generate current flow through the first impedance means; whereby the generation of the ON type signal by the voltage sensing means when the first current means is inhibited is indicative of no broken wires connected to the input means and failure to generate the ON type signal under such circumstances is indicative of at least one broken wire to the input means from the external signal.

11. An improved input module as defined in claim 10, wherein the first and second current limiting means each comprise a transistor and at least one biasing resistor for causing the associated transistor to be in its saturated mode of operation, wherein both current limiting means are coupled to each other, and further comprising a third impedance means connected at one end to the coupled first and second current limiting means and at a second end to the input means.

12. An improved input module as defined in claim 11, wherein the means for selectively inhibiting the first current limiting means comprises an opto-isolator which has input terminals for selectively turning on the opto-isolator, a field effect transistor (FET) having its gate connected to the output of the opto-isolator, a resistor connectable at one end to a reference voltage and at its second end to the source of the FET so as to have an output at said source connection representing the input voltage source to the first current limiting means, so that when the FET is not gated ON by the opto-isolator, a voltage is present at said output sufficient to saturate the first current limiting means and when the FET is turned ON by the opto-isolator, the voltage of said output is sufficiently reduced so as to turn the first current limiting means OFF.

13. An improved input module as defined in claim 12, wherein the external signal has an alternating voltage characteristic and wherein the improved input module further comprises means, connected to the input means, for converting the alternating voltage external signal to a uni-polarity voltage, said converting means having output terminals for presenting said uni-polarity voltage, and wherein the first impedance means is connected at one end to one of said output terminals.

14. A method of detecting the ON and OFF states of a signal, comprising the steps of:
1) sensing a parameter of the signal so as to generate an ON output signal if a threshold of said parameter is exceeded and for generating an OFF output signal otherwise;
2) providing a fixed impedance to the signal so that the current flow through said fixed impedance is substantially proportional to the voltage of the signal; and
3) further limiting the current flow through the fixed impedance if the signal threshold is exceeded by at least some amount.

* * * * *

UNITED STATES PATENT AND TRADEMARK OFFICE
CERTIFICATE OF CORRECTION

PATENT NO. : 5,398,025
DATED : March 14, 1995
INVENTOR(S) : Jerard I. Herman It is certified that error appears in the above-identified patent and that said Letters Patent is hereby corrected as shown below:

At column 3, line 31, please change "Which" to --which--.

At column 7, line 23, please change "genetic" to --generic--;

at lines 31-32 (claim 1, lines 4-5), please change "signal,so" to --signal so--.

At column 8, lines 20-21 (claim 8, lines 4-5), please change "convening" to --converting--.

Signed and Sealed this

Twelfth Day of September, 1995

Attest:

BRUCE LEHMAN

*Attesting Officer*      *Commissioner of Patents and Trademarks*